US008273587B2

(12) United States Patent
Basin et al.

(10) Patent No.: US 8,273,587 B2
(45) Date of Patent: Sep. 25, 2012

(54) UNDERFILL PROCESS FOR FLIP-CHIP LEDS

(75) Inventors: Grigoriy Basin, San Francisco, CA (US); Frederic Diana, Santa Clara, CA (US); Paul S. Martin, Pleasanton, CA (US); Dima Simonian, Sunnyvale, CA (US)

(73) Assignee: Lumileds Lighting Company LLC, San Jose, CA (US)

( * ) Notice: Subject to any disclaimer, the term of this patent is extended or adjusted under 35 U.S.C. 154(b) by 8 days.

(21) Appl. No.: 13/115,475

(22) Filed: May 25, 2011

(65) Prior Publication Data

US 2011/0223696 A1 Sep. 15, 2011

Related U.S. Application Data

(62) Division of application No. 12/050,082, filed on Mar. 17, 2008.

(51) Int. Cl.
*H01L 21/00* (2006.01)

(52) U.S. Cl. .......... 438/26; 257/687; 257/787; 438/112; 438/124; 438/127

(58) Field of Classification Search ..................... 438/26
See application file for complete search history.

(56) References Cited

U.S. PATENT DOCUMENTS

| | | | | |
|---|---|---|---|---|
| 6,274,399 | B1 | 8/2001 | Kern et al. | |
| 6,649,440 | B1 | 11/2003 | Krames et al. | |
| 7,138,293 | B2 * | 11/2006 | Ouellet et al. | 438/106 |
| 2005/0269582 | A1 | 12/2005 | Mueller et al. | |
| 2006/0105485 | A1 | 5/2006 | Basin et al. | |
| 2006/0202223 | A1 | 9/2006 | Sackrison et al. | |
| 2006/0281203 | A1 | 12/2006 | Epler et al. | |
| 2007/0202623 | A1 | 8/2007 | Gao et al. | |

FOREIGN PATENT DOCUMENTS

| | | | |
|---|---|---|---|
| EP | 1858086 | A1 | 11/2007 |
| WO | 2006131843 | A2 | 12/2006 |
| WO | 2007009042 | A1 | 1/2007 |
| WO | 2009007886 | A1 | 1/2009 |

* cited by examiner

*Primary Examiner* — Ajay K Arora

(57) ABSTRACT

An underfill technique for LEDs uses compression molding to simultaneously encapsulate an array of flip-chip LED dies mounted on a submount wafer. The molding process causes liquid underfill material (or a softened underfill material) to fill the gap between the LED dies and the submount wafer. The underfill material is then hardened, such as by curing. The cured underfill material over the top and sides of the LED dies is removed using microbead blasting. The exposed growth substrate is then removed from all the LED dies by laser lift-off, and the underfill supports the brittle epitaxial layers of each LED die during the lift-off process. The submount wafer is then singulated. This wafer-level processing of many LEDs simultaneously greatly reduces fabrication time, and a wide variety of materials may be used for the underfill since a wide range of viscosities is tolerable.

14 Claims, 3 Drawing Sheets

UNDERFILL PROCESS FOR FLIP-CHIP LEDS

This is a divisional of prior application Ser. No. 12/050, 082filed Mar. 17, 2008 and is incorporated by reference herein.

FIELD OF THE INVENTION

This invention relates to flip-chip light emitting diodes (LEDs) and, in particular, to a process for supplying a dielectric underfill material in the gap between the LED chip and its submount.

BACKGROUND

Prior art FIG. 1 illustrates a conventional LED 10 flip chip mounted on a portion of a submount wafer 22. In a flip-chip, both the n and p contacts are formed on the same side of the LED die opposite to the growth substrate 12 side.

In FIG. 1, the LED 10 is formed of semiconductor epitaxial layers, including an n-layer, an active layer, and a p-layer, grown on a growth substrate 12, such as a sapphire substrate. In one example, the epitaxial layers are GaN based, and the active layer emits blue light. Any other type of flip chip LED is applicable to the present invention.

Metal electrodes 14 are formed on the LED 10 that electrically contact the p-layer, and metal electrodes 16 are formed on the LED 10 that electrically contact the n-layer. In one example, the electrodes are gold bumps that are ultrasonically welded to anode and cathode metal pads 18 and 20 on a ceramic submount wafer 22. The submount wafer 22 has conductive vias 24 leading to bottom metal pads 26 and 28 for bonding to a printed circuit board. Many LEDs are mounted on the submount wafer 22 and will be later singulated to form individual LEDs/submounts.

Further details of LEDs can be found in the assignee's U.S. Pat. Nos. 6,649,440 and 6,274,399, and U.S. Patent Publications US 2006/0281203 A1 and 2005/0269582 A1, all incorporated herein by reference.

An underfill material 30 is then injected under and around the LED 10 to fill in air gaps between the LED 10 and submount wafer 22. The underfill material 30 is typically liquid epoxy that is then cured to harden. The hardened underfill provides structural support and protects the chip from contaminants. The underfill material 30 is injected by a nozzle 32 that is moved around the LED 10 while injecting the underfill material 30 at a relatively high pressure to fill the narrow gap between the LED 10 and submount wafer 22. The underfill may extend further laterally than shown in the figures in actual devices.

Any excess underfill material 30 (e.g., epoxy) on top of and around the LED 10/substrate 12 may be removed by microbead blasting.

After the underfill material 30 is cured and microbead blasted, the growth substrate 12 is then removed using a laser lift-off process (not shown). The photon energy of the laser (e.g., an excimer laser) is selected to be above the band gap of the LED material and below the absorption edge of the sapphire substrate (e.g., between 3.44 eV and 6 eV). Pulses from the laser through the sapphire are converted to thermal energy within the first 100 nm of the LED material. The generated temperature is in excess of 1000° C. and dissociates the gallium and nitrogen. The resulting high gas pressure pushes the substrate away from the epitaxial layers to release the substrate from the layers, and the loose substrate is then simply removed from the LED structure. The underfill helps prevent the thin LED layers from cracking under the high pressure.

The growth substrate 12 may instead be removed by etching, such as reactive ion etching (RIE), or grinding. Other techniques may be used depending on the type of LED and substrate. In one example, the substrate is Si-based and an insulating material between the substrate and the LED layers is etched away by a wet etch technique to remove the substrate.

After any other wafer-level processes, the submount wafer 22 is then sawed or scribed and broken to singulate the LEDs/submounts. The submounts may then be soldered to a printed circuit board.

Problems with the prior art underfill technique include the following.

Providing a precise amount of underfill material to only fill under and around the thin LED layers is difficult and time-consuming. The underfill process is sequentially performed on an array of LEDs mounted on a submount wafer, prior to the LEDs being singulated. There may be 500-4000 LEDs mounted on a single submount wafer, depending on the size of each LED and the density. Injecting the underfill material under each LED in the array using a single moving nozzle may take 10-40 minutes, depending on the number of LEDs.

Another problem is that the properties of the underfill material must be carefully selected for proper viscosity, thermal expansion, reliability over the long lifetime of the LED, dielectric properties, thermal conductivity, contaminant protection, and other factors. If the viscosity is too high, the pressure needed to inject the underfill under the LED to fill all voids may damage the LED. Voids must be eliminated since any air will expand when the LED/submount becomes hot and push the LED off the submount. Further, since a void area does not support the LED during the laser lift-off process, the downward stress on the LED during the laser lift-off process may crack the LED.

Thermal expansion of the underfill is extremely important since the LEDs undergo a solder reflow process when soldering a singulated LED/submount to a printed circuit board. Such temperatures may be 265° C. The solder reflow temperature is above the typical 185° C. glass transition temperature for epoxy, which is the typical underfill material. As it relates to an epoxy, the glass transition temperature ($T_g$) is the temperature at which epoxy becomes soft. Above the glass transition temperature, the epoxy thermal expansion rises significantly, causing upward pressure on the LED, resulting in cracking or lifting off of the LED.

What is needed is an improved technique for underfilling an LED that avoids the above-mentioned problems and material limitations.

SUMMARY

An underfill technique for LEDs is described where compression molding is used. The process is performed prior to any substrate lift-off process. The LEDs, mounted on a submount wafer, are placed in a mold. The mold is sealed at least around the perimeter of the submount wafer, and a vacuum is created within the mold. The mold may be aluminum with separate cavities aligned with each LED on the submount wafer. In one embodiment, there are flow channels interconnecting each cavity to a vacuum source and to at least one liquid material inlet.

Any suitable underfill material, such as a liquid polyimide, is then applied to the inlet of the mold under pressure, and the combination of the vacuum and the liquid material pressure causes the material to completely fill the cavities in the mold where the LEDs are located. There are no voids once the material has filled the mold.

The dimensions of each mold cavity cause the liquid material to completely encapsulate each LED, along with its growth substrate.

The liquid material is then cured by heat or UV light to harden the underfill material, and the mold is released from the submount wafer. A higher temperature post cure may be performed after the mold is released.

In another embodiment, the liquid underfill material may first fill the mold, having a peripheral raised seal, and then the submount wafer is placed over the mold so that the LEDs are immersed in the underfill material. Under compression, the liquid material fills all voids under each LED. Air is pushed out through the seals along with a certain amount of the underfill material. The material is then cured, and the mold released from the submount wafer. Since such a molding process does not rely on the injection of the liquid material under pressure at an inlet of the mold, there is little possibility of damage to the fragile LEDs.

In another embodiment, the underfill material used to fill the mold is not a liquid but is a powder or small tablets. The solid material is then heated in the mold to melt or soften it so that it can conform to the mold and encapsulate the LEDs. Compression is used to mold the softened material and cause it to flow into the voids under each LED. Handling the underfill material as a solid has various benefits. Such compression molding using an initially solid underfill material greatly increases the number of possible underfill materials. One of the materials which can be used for this process is the powder of an epoxy molding compound.

After the submount wafer is removed from the mold, the entire submount wafer is subjected to a microbead blasting process to etch away the underfill material until all of the growth substrate is exposed. The substrate is then removed using a laser lift-off process, or other suitable process. The underfill supports the thin LED during this process.

After the growth substrate has been removed, the LED may be thinned to improve light extraction. The surface of the LED may then be roughened to further improve light extraction by reducing the number of internal reflections.

Lenses may then be molded over the LEDs and/or other wafer-level processing techniques may be performed.

The LEDs/submounts are then singulated using sawing, scribe and break, or any other technique.

By using the above method, a much wider variety of materials may be used for the underfill since a much wider range of viscosities are tolerable. When using the prior art jet nozzle, the material could only have a narrow range of viscosities. A preferred underfill material that can be used with the present process is a polyimide, which has a glass transition temperature near or above the solder reflow temperature, so that there is very little thermal expansion of the polyimide under worst case conditions.

Further, since all the LEDs on the submount wafer (e.g., 500-4000 LEDs) are underfilled at the same time, the underfill processing time can be reduced to only a few minutes.

BRIEF DESCRIPTION OF THE DRAWINGS

Elements that are the same or equivalent are labeled with the same numeral.

DETAILED DESCRIPTION

As a preliminary matter, a conventional LED is formed on a growth substrate. In the example used, the LED is a GaN-based LED, such as an AlInGaN or InGaN LED, for producing blue light. Typically, a relatively thick n-type GaN layer is grown on a sapphire growth substrate using conventional techniques. The relatively thick GaN layer typically includes a low temperature nucleation layer and one or more additional layers so as to provide a low-defect lattice structure for the n-type cladding layer and active layer. One or more n-type cladding layers are then formed over the thick n-type layer, followed by an active layer, one or more p-type cladding layers, and a p-type contact layer (for metallization).

For a flip-chip, portions of the p-layers and active layer are etched away to expose an n-layer for metallization. In this way, the p contact and n contact are on the same side of the chip and can be directly electrically attached to the submount contact pads. Current from the n-metal contact initially flows laterally through the n-layer.

Other types of LEDs that can be used in the present invention include AlInGaP LEDs, which can produce light in the red to yellow range.

Figure 1:
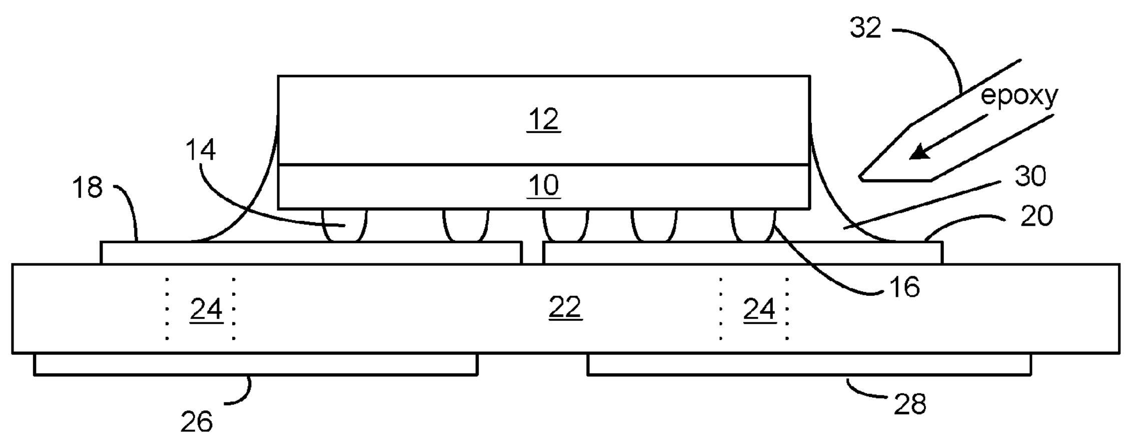
FIG. 1 is a cross-sectional view of a prior art flip-chip LED, mounted on a submount, where the LED underfill material is dispensed under pressure by a small nozzle at the base of the LED.

The flip-chip LED used as an example in the present invention is the LED structure of FIG. 1 comprising a semiconductor LED 10, its growth substrate 12, and its electrodes 14/16, where the LED is mounted on a submount wafer 22.

Figure 2:
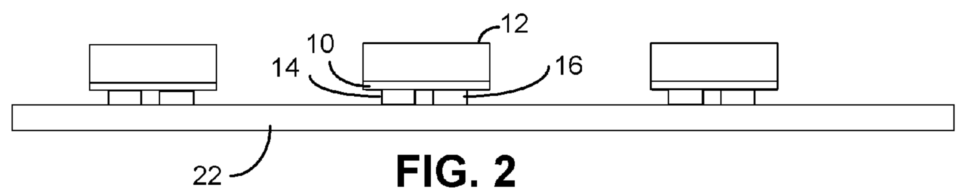
FIG. 2 illustrates a simplified portion of a submount wafer populated by an array of LEDs, such as 500-4000 LEDs.

FIG. 2 is a simplified illustration of a submount wafer 22 on which is mounted an array of LEDs. There may be 500-4000 LEDs on a single submount wafer 22. An LED is also referred to herein as an LED die.

Instead of positioning a nozzle at the based of each LED for injecting an underfill material under each LED in the array, a wafer-level molding process is performed.

Figure 3A:
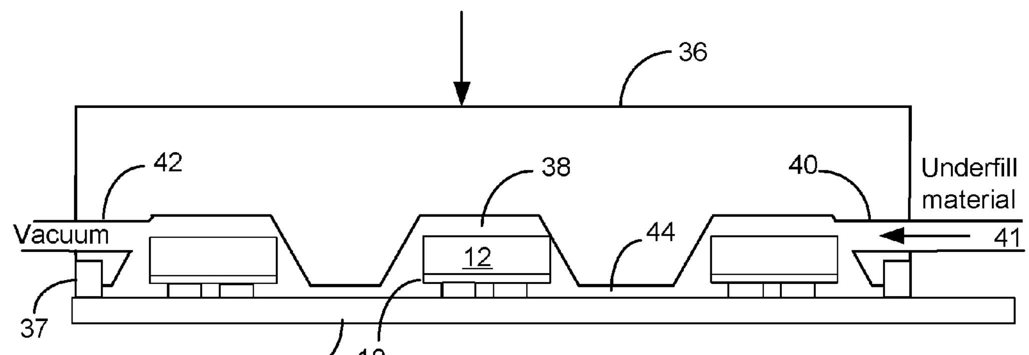
FIG. 3A illustrates a wafer-level injection molding process used to encapsulate all LEDs on the submount wafer with an underfill material.

FIG. 3A illustrates one type of suitable injection molding process for creating the underfill for each LED. A mold 36 has cavities 38 that define the shape of the hardened underfill material after the molding process. The mold 36 may be formed of aluminum. The mold 36 has a perimeter seal 37 that seals against the submount wafer 22 when the mold 36 is aligned with the wafer 22 and pressed against the wafer 22.

The mold 36 has at least one inlet 40, for injecting the liquid underfill material 41 (e.g., a polyimide), and at least one outlet 42 connected to a vacuum source. Once the mold 36 is sealed against the wafer 22, a vacuum is created within the mold 36, and the underfill material 41 is injected through inlet 40. The underfill material 41 flows into all the cavities 38 via channels 44 between the cavities, assisted by the vacuum and the injection pressure of the material 41. The vacuum removes almost all the air in the mold 36. Ultimately, the entire mold 36 will be filled with the underfill material 41, including all voids under the LEDs.

The mold 36 is then heated to cure the liquid underfill material. The temperature of the mold 36 during curing is about 150° C. Alternatively, a transparent mold may be used and the underfill material may be cured with UV light.

Figure 3B:
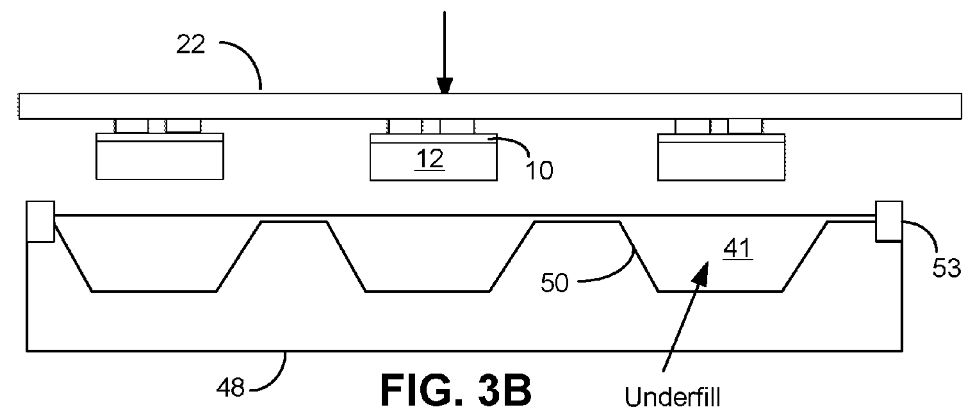
FIG. 3B illustrates an alternative type of wafer-level molding process, not using injection, used to encapsulate all LEDs on the submount wafer with an underfill material.

FIG. 3B illustrates an alternative wafer-level molding process that does not use pressure injection of the underfill material. In FIG. 3B, the mold 48 has cavities 50 that are first filled with the liquid underfill material 41 at atmospheric pressure. The submount wafer 22 is brought against the mold 48 so that the LEDs are immersed in the underfill material in each cavity 50. The wafer 22 and mold 48 are pressed together to force the underfill material to fill all voids. A perimeter seal 53 allows the pressure to be high while allowing all air to escape as the underfill material fills the voids. A vacuum may also be pulled between the wafer 22 and the mold 48 using a vacuum source around the seal 53.

The mold 48 is then heated to cure the liquid underfill material. Alternatively, a transparent mold may be used and the underfill material may be cured with UV light.

Figure 4:
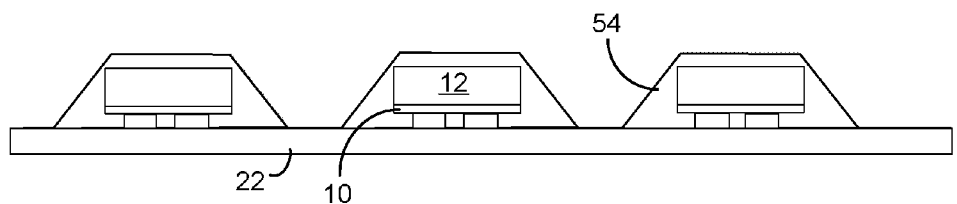
FIG. 4 illustrates the LEDs on the wafer after being removed from the mold of FIG. 3A or FIG. 3B.

The mold of FIG. 3A or 3B is then removed from the wafer 22, resulting in the structure of FIG. 4, having excess hardened underfill material 54 encapsulating each LED. There may also be a thin layer of hardened underfill material on the wafer 22 surface between each LED depending on the mold.

The wafer 22 may then be subject to a post-cure temperature of about 250° C. to additionally harden the underfill material. For an epoxy molding compound or a polyimide underfill, its glass transition temperature (Tg) is between 260-300° C., so a post cure temperature less than the Tg is preferred to limit any thermal expansion of the underfill.

In another embodiment, the underfill material used to fill the mold is not a liquid but is a powder or small tablets. The solid material is then heated in the mold of FIG. 3A or FIG. 3B to melt or soften it. Compression is used to cause the softened material to take the form of the mold and to fill the voids under the LEDs while encapsulating the LEDs. The melted or softened material is then cured or cooled, if necessary, to make it solid again. Certain materials hardened automatically after the heating and compression process. Handling the underfill material as a solid has various benefits. Further, some suitable materials that can be used for an underfill are not a liquid at room temperatures prior to curing, so heating up a solid material in the mold followed by compression greatly increases the number of possible materials that can be used as an underfill. One suitable solid polymer that can be used is an epoxy molding compound in powder form.

To perform a laser lift-off process to remove the growth substrates 12, the underfill material 54 over the growth substrate 12 must be first removed. If the growth substrate 12 will be removed by grinding or another mechanical etch process, such grinding may be used to simultaneously remove the excess underfill material 54.

Figure 5:
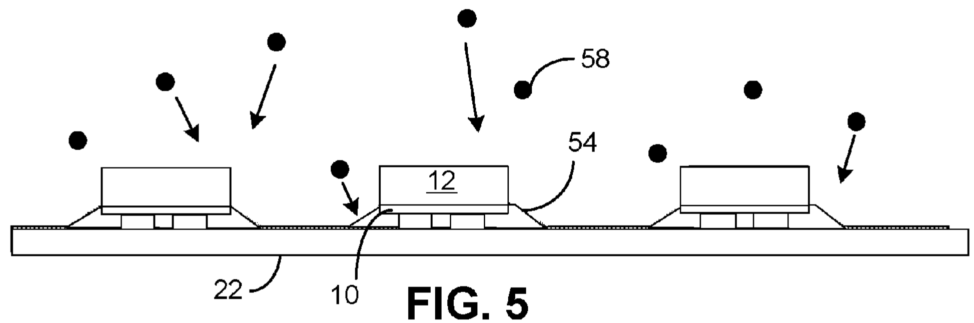
FIG. 5 illustrates the upper portion of the underfill material of FIG. 4 being removed by microbead blasting.

FIG. 5 illustrates the removal of the excess underfill material 54 by blasting the entire surface of the wafer 22 with high-velocity microbeads 58. In one embodiment, the microbeads 58 have diameters between 1-20 microns and are formed of $NaHCO_3$. The microbeads 58 are accelerated through a nozzle by air at a pressure of about 100 psi or less. The nozzle may be large to etch the underfill material 54 from all or a large portion of the wafer 22 without the nozzle moving, or a smaller nozzle may be used to etch the underfill material 54 off only a few LEDs at a time followed by the nozzle moving to a next position over the wafer 22. Removing excess material of any kind using microbeads is a known process. The underfill material 54 is etch so that its top surface intersects an edge of the LED semiconductor layers to ensure that the entire LED is supported by the underfill during the substrate laser lift-off process.

Figure 6:
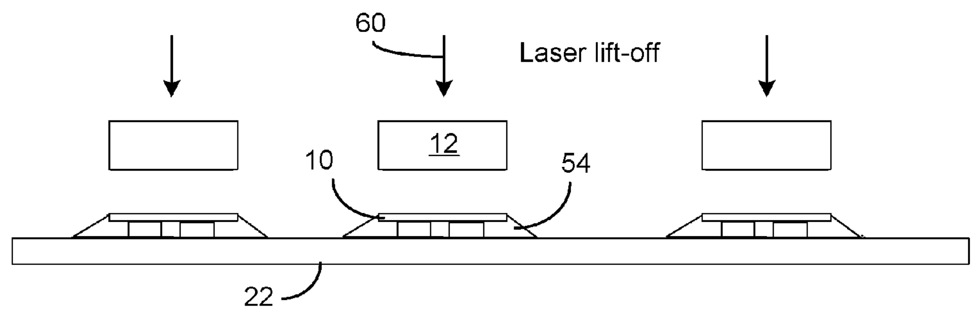
FIG. 6 illustrates a laser lift-off technique for removing the growth substrates from the LEDs.

FIG. 6 illustrates the laser lift-off process, previously described. The laser pulses are shown by arrows 60. During the laser lift, the surface of the GaN absorbs heat, causing the surface layer to decompose into the Ga and $N_2$. The $N_2$ pressure pushes the sapphire substrate away from the LED. After the growth substrates 12 become detached from the semiconductor LED layers during the lift-off process, they are removed by, for example, an adhesive sheet or some other suitable process.

The exposed LED layers are then thinned by, for example, RIE or a mechanical etch, since the exposed top layer is a relatively thick n-layer, and the surface has been damaged by the laser lift-off process. The resulting top surface may then be roughened to increase the light extraction efficiency.

Other wafer-level processes may also be performed on the LED array while mounted on the submount wafer 22. One such process may be to overmold a lens on each LED in a single mold process similar to that shown in FIG. 3A or 3B. Details of a wafer-level lens molding process are described in Patent Publication US 2006/0105485, entitled Overmolded Lens Over LED Die, by Grigoriy Basin et al., assigned to the present assignee and incorporated herein by reference.

Figure 7:
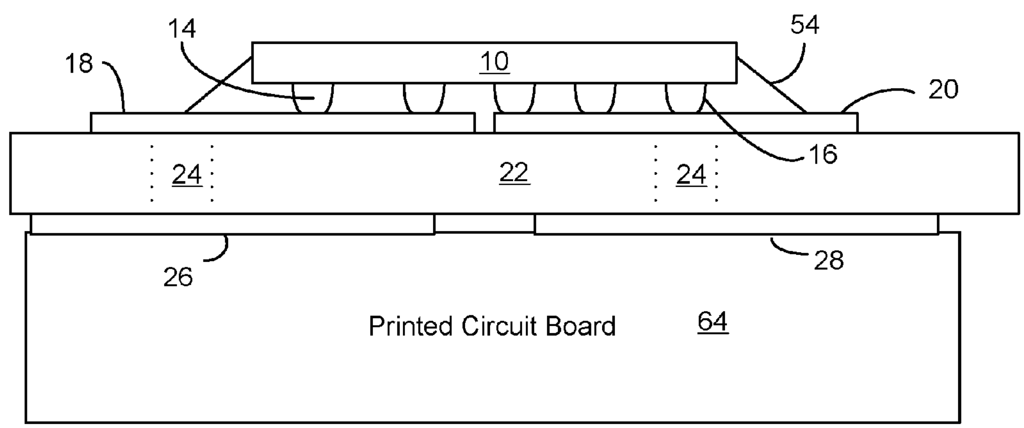
FIG. 7 is a cross-sectional view of a single LED mounted on a submount after the LED has been thinned and after the LEDs/submounts have been singulated. The submount is shown soldered to a printed circuit board.

The submount wafer 22 is then singulated to form individual LEDs/submounts. FIG. 7 illustrates a single LED/submount soldered to pads on a printed circuit board 64.

Since there is a wide range of viscosities of the liquid underfill material that are suitable when using the underfill molding process described herein, the underfill material may be selected substantially independently of its viscosity. The dielectric underfill material may be primarily chosen based on its coefficient of thermal expansion, ease of use, and reliability under all temperatures to which the LED is subjected. A polyimide is the preferred underfill, possessing much better qualities than epoxy.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method for fabricating a light emitting device comprising:

providing a flip-chip light emitting diode (LED) die on a submount, there being a gap between the LED die and the submount, the LED die having a bottom surface facing the submount and a top surface opposite the bottom surface;

molding an underfill material over the LED die so that the underfill material encapsulates the LED die and substantially completely fills the gap between the LED die and the submount; and removing the underfill material at least over a top surface of the LED die, wherein the LED die comprises epitaxial layers grown on a growth substrate, wherein a top surface of the growth substrate is the top surface of the LED die, wherein removing the underfill material comprises removing the underfill material from at least the top surface of the growth substrate.

2. The method of claim 1 further comprising removing the growth substrate from the epitaxial layers after removing the underfill material from at least the top surface of the growth substrate.

3. The method of claim 2 wherein the substrate is removed from the epitaxial layers by a laser lift-off technique after the step of removing the underfill material.

4. The method of claim 1 wherein removing the underfill material comprises removing the underfill material using microbead blasting.

5. The method of claim 1 wherein removing the underfill material comprises removing the underfill material by etching.

6. The method of claim 1 wherein molding the underfill material over the LED die comprises:

providing a solid underfill material in a mold;

heating the mold to melt or soften the underfill material;

positioning the LED die on the submount with respect to the mold to compress the melted or softened underfill material and encapsulate the LED die; and cooling the underfill material.

7. The method of claim 1 wherein molding the underfill material over the LED die comprises:

positioning the LED die on the submount with respect to a mold;

creating a substantial vacuum between the submount and a mold cavity;

filling the mold cavity under pressure with a liquid underfill material to encapsulate the LED die; and curing the underfill material.

8. The method of claim 1 wherein molding the underfill material over the LED die comprises:

filling a mold cavity with a softened underfill material;

immersing the LED die into the softened underfill material; and curing the underfill material.

9. The method of claim 1 wherein providing a flip-chip LED die on a submount comprises providing a plurality of LED dies on a submount wafer, the submount wafer having electrodes bonded to corresponding electrodes of the plurality of LED dies, each LED die having a gap between the LED die and the submount wafer, and wherein the step of molding the underfill material is performed simultaneously on all the LED dies.

10. The method of claim 9 further comprising singulating the submount wafer to separate LED dies mounted on their respective submount portions, after the step of removing the underfill material.

11. The method of claim 1 wherein the underfill material is a polymer.

12. The method of claim 1 wherein the underfill material is an epoxy molding compound.

13. The method of claim 1 wherein removing the underfill material comprises removing the underfill material to fully expose all side surfaces of the growth substrate.

14. The method of claim 1 wherein molding the underfill material over the LED die comprises providing a solid underfill material in a mold cavity, heating the mold to melt or soften the underfill material, compressing the underfill material, then cooling the underfill material to harden it and encapsulate the LED die.

* * * * *